US011431416B2

(12) United States Patent
Gopalakrishnan et al.

(10) Patent No.: US 11,431,416 B2
(45) Date of Patent: *Aug. 30, 2022

(54) PAM4 TRANSCEIVERS FOR HIGH-SPEED COMMUNICATION

(71) Applicant: MARVELL ASIA PTE, LTD., Singapore (SG)

(72) Inventors: Karthik Gopalakrishnan, San Jose, CA (US); Jamal Riani, San Jose, CA (US); Arun Tiruvur, San Jose, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/171,801

(22) Filed: Feb. 9, 2021

(65) Prior Publication Data

US 2021/0167858 A1    Jun. 3, 2021

Related U.S. Application Data

(63) Continuation of application No. 16/696,913, filed on Nov. 26, 2019, now Pat. No. 10,951,318, which is a
(Continued)

(51) Int. Cl.
*H04B 10/00* (2013.01)
*H04L 7/04* (2006.01)
(Continued)

(52) U.S. Cl.
CPC .............. *H04B 10/40* (2013.01); *H03K 5/00* (2013.01); *H03K 19/018521* (2013.01);
(Continued)

(58) Field of Classification Search
CPC ....... H04B 10/40; H04B 10/541; H04L 25/49; H04L 7/0331; H04L 25/00; H04L 7/0079;
(Continued)

(56) References Cited

U.S. PATENT DOCUMENTS 5,592,612 A     1/1997   Birk
6,128,094 A    10/2000   Smith
(Continued)

OTHER PUBLICATIONS

Office Action for U.S. Appl. No. 13/653,373, dated Mar. 27, 2014.
(Continued)

*Primary Examiner* — Don N Vo

(57) ABSTRACT

A communication device includes an AFE configured to track and hold a first driving signal to produce a plurality of sample signals, a shift and hold module configured to store the plurality of sample signals, and an ADC configured to respectively convert the plurality of sample signals to a plurality of digitized sample signals, the ADC including a plurality of ADC slices. A DSP is configured to calibrate the AFE based on the plurality of ADC slices corresponding to the plurality of digitized sample signals and generate an output data stream comprising the plurality of digitized samples. A skew management module is configured to detect a skew of the plurality of digitized sample signals in the output data stream generated by the DSP module, generate a programmable skew offset based on the detected skew, and correct the skew in the output data stream based on the programmable skew offset.

11 Claims, 9 Drawing Sheets

Related U.S. Application Data continuation of application No. 16/249,642, filed on Jan. 16, 2019, now Pat. No. 10,523,328, which is a continuation of application No. 15/809,902, filed on Nov. 10, 2017, now Pat. No. 10,218,444, which is a continuation of application No. 15/061,923, filed on Mar. 4, 2016, now Pat. No. 9,847,839.

(51) Int. Cl.

| | | |
|---|---|---|
| *H03K 7/02* | (2006.01) | |
| *H04B 10/40* | (2013.01) | |
| *H03K 5/00* | (2006.01) | |
| *H03K 19/0185* | (2006.01) | |
| *H03L 7/093* | (2006.01) | |
| *H03L 7/099* | (2006.01) | |
| *H03L 7/197* | (2006.01) | |
| *H03L 7/23* | (2006.01) | |
| *H04L 7/00* | (2006.01) | |
| *H04L 25/00* | (2006.01) | |
| *H04L 25/49* | (2006.01) | |
| *H04B 10/54* | (2013.01) | |
| *H04L 7/033* | (2006.01) | |

(52) U.S. Cl.
CPC .............. *H03L 7/093* (2013.01); *H03L 7/099* (2013.01); *H03L 7/1976* (2013.01); *H03L 7/23* (2013.01); *H04B 10/541* (2013.01); *H04L 7/0037* (2013.01); *H04L 7/0079* (2013.01); *H04L 7/0087* (2013.01); *H04L 7/0091* (2013.01); *H04L 7/0331* (2013.01); *H04L 25/00* (2013.01); *H04L 25/49* (2013.01); *H03L 2207/06* (2013.01); *H04L 7/0062* (2013.01)

(58) Field of Classification Search
CPC ... H04L 7/0091; H04L 7/0087; H04L 7/0037; H04L 7/0062; H03L 7/23; H03L 7/1976; H03L 7/099; H03L 7/093; H03L 2207/06; H03K 19/018521; H03K 5/00
USPC ......... 398/136; 375/353, 355, 362, 371, 376
See application file for complete search history.

(56) References Cited

U.S. PATENT DOCUMENTS

| | | | |
|---|---|---|---|
| 6,400,621 | B2 | 6/2002 | Hidaka et al. |
| 6,542,956 | B1 | 4/2003 | Lee et al. |
| 6,993,701 | B2 | 1/2006 | Corbett et al. |
| 7,656,727 | B2 | 2/2010 | Thayer |
| 7,990,746 | B2 | 8/2011 | Rajan |
| 8,325,554 | B2 | 12/2012 | Sweere et al. |
| 8,687,451 | B2 | 4/2014 | Wang |
| 9,571,115 | B1* | 2/2017 | Beukema .............. H03M 1/069 |
| 10,951,318 | B2* | 3/2021 | Gopalakrishnan ...... H03L 7/099 |
| 2004/0123029 | A1 | 6/2004 | Dalal et al. |
| 2006/0200697 | A1 | 9/2006 | Ito |
| 2007/0188367 | A1* | 8/2007 | Yamada ................. H03M 1/123 341/155 |
| 2007/0279274 | A1* | 12/2007 | Hsieh .................. H03M 1/1225 341/155 |
| 2008/0069198 | A1* | 3/2008 | Bhoja ................... H04L 25/061 375/233 |
| 2008/0104290 | A1 | 5/2008 | Cowell et al. |
| 2008/0183959 | A1 | 7/2008 | Pelley et al. |
| 2009/0141558 | A1 | 6/2009 | Sarin et al. |
| 2009/0300259 | A1 | 12/2009 | Luo et al. |
| 2010/0005212 | A1 | 1/2010 | Gower et al. |
| 2010/0162037 | A1 | 6/2010 | Maule et al. |
| 2010/0199125 | A1 | 8/2010 | Reche |
| 2010/0274952 | A1 | 10/2010 | Lee |
| 2011/0072200 | A1 | 3/2011 | Lee et al. |
| 2011/0125990 | A1 | 5/2011 | Khosravi et al. |
| 2011/0170329 | A1 | 7/2011 | Kang |
| 2012/0081246 | A1* | 4/2012 | Caci .................... H03M 1/1215 341/155 |
| 2012/0151294 | A1 | 6/2012 | Joo et al. |
| 2012/0243299 | A1 | 9/2012 | Shau |
| 2012/0257459 | A1 | 10/2012 | Berke |
| 2012/0297231 | A1 | 11/2012 | Qawami et al. |
| 2013/0060996 | A1 | 3/2013 | Berke |
| 2016/0126970 | A1* | 5/2016 | Xu ......................... H03M 1/36 341/118 |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.
Cheng-Chung Hus et al., "An 11b 800MS/s Time-Interleaved ADC wth Digital Background Calibration", Proceedings of the 2007 International Solid State Circuit Conference, Feb. 14, 2007, pp. 464-465, 615.
Sandeep Gupta et al., "A 1GS/s 11b Time-Interleaved ADC in 0.13 μm CMOS", Proceedings of the 2006 International Solid State Circuit Conference, Feb. 8, 2006, Session 31-6.
Shahriar Shahramian et al., "A 30-GS/s Track and Hold Amplifier in 0.13-μm CMOS Technology", IEEE 2006 Custom Integrated Circuits Conference, 2006, pp. 493-496.
Simon Louwsma et al., "A Time-Interleaved Track & Hold in 0.13 μm CMOS sub-sampling a 4 GHz Signal with 43dB SND", IEEE 2007 Custom Integrated Circuits Conference, 2007, pp. 329-332.
Francesco Centurelli et al., "Design Solutions for Sample-and-Hold Circuits in CMOS Nanometer Technologies", IEEE Transactions of Circuits and Systems-II: Express Briefs, Jun. 2009, pp. 459-463, vol. 56, No. 6.
Tang Kai et al., "A 20GSps Track-and-Hold Circuit in 90nm CMOS Technology", 2012 International Conference on Advanced Technologies for Communications, 2012, pp. 237-240.

* cited by examiner

PAM4 TRANSCEIVERS FOR HIGH-SPEED COMMUNICATION

CROSS-REFERENCES TO RELATED APPLICATIONS

This application is a continuation of U.S. patent application Ser. No. 16/696,913, filed Nov. 26, 2019, which is a continuation of U.S. patent application Ser. No. 16/249,642 filed Jan. 16, 2019, now Issued as U.S. Pat. No. 10,523,328 on Dec. 31, 2019, which is a continuation of U.S. patent application Ser. No. 15/809,902 filed Nov. 10, 2017, now Issued as U.S. Pat. No. 10,218,444 on Feb. 26, 2019, which is a continuation of U.S. patent application Ser. No. 15/061,923 filed Mar. 4, 2016, now Issued as U.S. Pat. No. 9,847,839 on Dec. 19, 2017, which is related to the following patent applications, which are commonly owned and incorporated by reference herein for all purposes: U.S. patent application Ser. No. 14/304,635, filed 13 Jun. 2014; U.S. patent application Ser. No. 14/597,120, filed 14 Jan. 2015; U.S. patent application Ser. No. 14/614,257, filed 4 Feb. 2015; U.S. patent application Ser. No. 14/614,253, filed 4 Feb. 2015; U.S. patent application Ser. No. 14/681,989, filed 8 Apr. 2015; and U.S. patent application Ser. No. 14/842,699, filed 1 Sep. 2015.

BACKGROUND OF THE INVENTION

The present invention is directed to communication systems.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-speed data communication applications, pulse-amplitude modulation (PAM) technique is often used. Among other things, PAM ($2^n$, with n>1) provides an improved spectral efficiency that allows for higher data throughput on communication media.

Over the past, there have been many types of communication systems and methods. Unfortunately, they have been inadequate for various applications. Therefore, improved systems and methods are desired.

BRIEF SUMMARY OF THE INVENTION

The present invention is directed to data communication. More specifically, embodiments of the present invention provide a transceiver that processes an incoming data stream and generates a recovered clock signal based on the incoming data stream. The transceiver includes a voltage gain amplifier that also performs equalization and provides a driving signal to track and hold circuits that hold the incoming data stream, which is stored by shift and holder buffer circuits. Analog to digital conversion is then performed on the buffer data by a plurality of ADC circuits. Various DSP functions are then performed over the converted data. The converted data are then encoded and transmitted in a PAM format. There are other embodiments as well.

According to an embodiment, the present invention provides a transceiver system that includes an input terminal for receiving input data stream. The first data stream is characterized by a first frequency. The system also includes a clock generation module that is configured to generate a clock signal based at least one the data stream. The system additionally includes a regulator coupled to a power source. The regulator is configured to attenuate noises associated with the power source. The system further includes a first voltage gain amplifier being configured to generate a first driving signal. The system also includes a track and hold (T/H) module comprising a first plurality of T/H circuits. The first plurality of T/H circuits is controlled by the first driving signal for holding the input data stream at a second frequency. The system additionally includes a shift and hold (SH) buffer comprising a first plurality of buffer units corresponding to the first plurality of T/H circuits. The first plurality of buffer units is configured to store a first plurality of samples based on the input data stream. The system further includes an ADC module that includes a first plurality of ADC circuits configured to convert the first plurality of samples. The system additionally includes a digital signal processor (DSP) that is configured to generate output data stream based at least one the first plurality of samples. The system also includes an output terminal for transmitting the output data stream.

According to another embodiment, the present invention provides a transceiver system that includes an input terminal for receiving input data stream, which is characterized by a first frequency. The system also includes a clock generation module that is configured to generate a clock signal based at least one the data stream. The system additionally includes a first voltage gain amplifier being configured to generate a first driving signal. The system further includes a track and hold (T/H) module that includes a first plurality of T/H circuits. The first plurality of T/H circuits is controlled by the first driving signal for holding the input data stream at a second frequency. The system further includes a shift and hold (SH) buffer that has a first plurality of buffer units corresponding to the first plurality of T/H circuits. The first plurality of buffer units is configured to store a first plurality of samples based on the input data stream. The system also includes an ADC module that has a first plurality of ADC circuits being configured to convert the first plurality of samples. The system further includes a digital signal processor (DSP) that is configured to generate output data stream based at least one the first plurality of samples. The DSP includes a decision feedback equalizer for reducing errors. The system further includes an output terminal for transmitting the output data stream.

According to yet another embodiment, the present invention provides a transceiver system that includes an input terminal for receiving input data stream, which is characterized by a first frequency. The system also includes a clock generation module that is configured to generate a clock signal based at least one the data stream. The system further includes a first voltage gain amplifier that is configured to generate a first driving signal. The system also includes a second voltage gain amplifier that is configured generate a second driving signal. The system further includes a track and hold (T/H) module that includes a first plurality of T/H circuits and a second plurality of T/H circuits. The first plurality of T/H circuits is controlled by the first driving signal for holding the input data stream at a second frequency. The second T/H circuit is controlled by the second driving signal for holding the input data stream at the second frequency. The system further includes a shift and hold (SH)

buffer that includes a first plurality of buffer units corresponding to the first plurality of T/H circuits and a second plurality of buffer units corresponding to the second plurality of T/H circuits. The first plurality of buffer units is configured to store a first plurality of samples based on the input data stream. The system additionally includes an ADC module comprising a first plurality of ADC circuits that is configured to convert the first plurality of samples. The system also includes a digital signal processor (DSP) that is configured to generate output data stream based at least one the first plurality of samples. The system also includes an output terminal for transmitting the output data stream.

It is to be appreciated that embodiments of the present invention provide many advantages. Among other things, compared to conventional system, transceivers according to embodiments of the present invention utilizes an integrated voltage gain amplifier that provides equalization functions, thereby eliminating the needs of a separate equalization module, reducing power consumption, and reducing noise. In addition, the need for a reference clock signal can be eliminated to reduce power consumption. The transceiver includes DSP module(s) that provide functions such as reflection cancellation, skew management, eye modulation, offset correction, error correction, and/or others. Additionally, transceiver systems can be manufactured using existing fabrication techniques, such as 28 nm processes. Furthermore, transceivers systems according to the present invention can be configured to be compatible with existing communication systems. There are other advantages as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
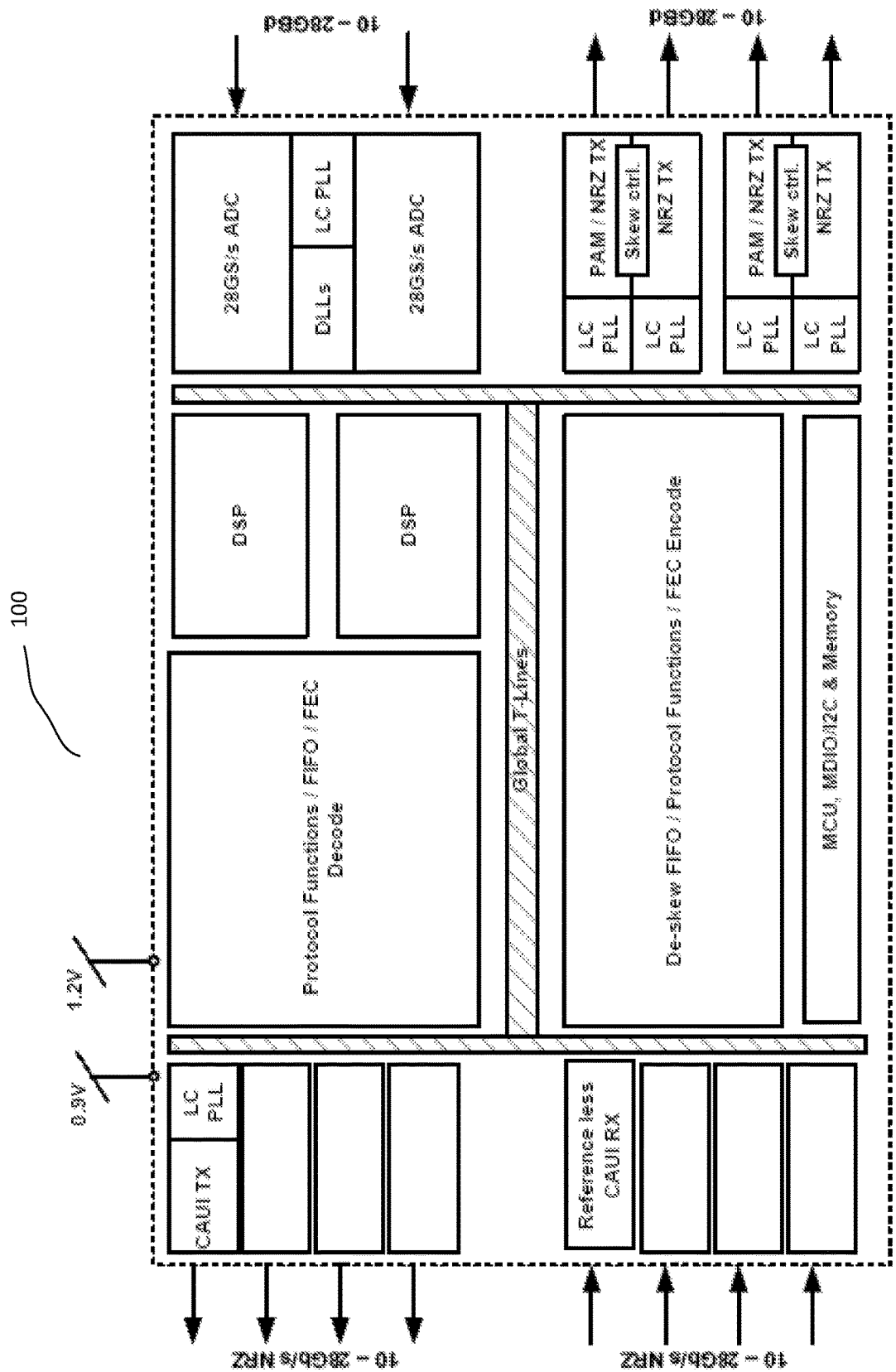
FIG. 1 is a simplified diagram illustrating a transceiver system according to an embodiment of the present invention.

The present invention is directed to data communication. More specifically, embodiments of the present invention provide a transceiver that processes an incoming data stream and generates a recovered clock signal based on the incoming data stream. The transceiver includes a voltage gain amplifier that also performs equalization and provides a driving signal to track and hold circuits that hold the incoming data stream, which is stored by shift and holder buffer circuits. Analog to digital conversion is then performed on the buffer data by a plurality of ADC circuits. Various DSP functions are then performed over the converted data. The converted data are then encoded and transmitted in a PAM format. There are other embodiments as well.

High speed signaling using NRZ has approached speeds above 50-Gb/s where it is extremely difficult to maintain power efficiency and performance over a wide variety of channels and applications. PAM4 is emerging as one way forward to increase throughput in such band-limited channels. Higher modulation formats also helps mitigate cost in optical systems by packing more bits per wavelength. Strong momentum in standards to adopt PAM4 reflects these significant trends in the industry. At the same time, migrating transceivers designs to current technology nodes have narrowed the power gap between traditional Analog and ADC-DSP-DAC based systems at high-speed. These factors make ADC-based receivers a highly desirable design choice, as is also the trend in wireless communications.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35

U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

It is to be appreciated that embodiments of the present invention provide transceiver systems that can operate at high speed (e.g., 40/50/100/400 Gb/s). In certain implementations, transceivers are configured to use non-return to zero ("NRZ") and/or pulse amplitude modulation ("PAM") modulation techniques. For example, PAM4 modulation is used for data communication over optical communication networks. FIG. 1 is a simplified diagram illustrating a transceiver system according to an embodiment of the present invention. This diagram is merely an example, which should not unduly limit the scope of the claims. One of ordinary skill in the art would recognize many variations, alternatives, and modifications. Among other things, transceiver 100 is configured to provide various types of networking applications. As shown in FIG. 1, transceiver 100 is configured to receive data at a high rate (e.g., 10-20 Gb/s). Data transmitted from transceiver 100 can be in various formats, such as NRZ, PAM4, and/or other formats. Transceiver 100 includes phase-lock loop ("PLL") devices for clock recovery. In certain embodiments, transceiver 100 is implemented without a reference clock and uses clock signal recovered by the PLL from incoming data. The recovered clock from the host interface is filtered through the line receive pll path prior to retransmit. While eliminating a reference, this also allows for independent control of jitter tolerance on the host and jitter transfer through the line. In certain embodiments, incoming data are processed before transmitted. For example, data processing may include data buffering, aligning incoming data from multiple communication lanes, forward error correction ("FEC"), and/or others. For example, data is first received by an analog front end (AFE), which prepares the incoming for digital processing. The digital portion (e.g., DSPs) of the transceivers provides various functions in the digital domain, such as skew management, equalization, reflection cancellation, and/or other functions. It is to be appreciated that filtering the recovered clock through the PLL path can provide many benefits, as it allows the system to independently filter the recovered clock multiple times (e.g., through RX PLL and/or TX PLL), and to eliminate the reference clock buffer, thereby saving both power and cost.

The incoming data is characterized by a data frequency, which can be determined by sweeping a predetermined frequency range. For example, the transceiver is configured to acquire sampling frequency by sweeping through a predetermined frequency range, performing data sampling at different frequencies within the predetermined frequency range, and determining a target frequency for sampling data based on a maximum early peak frequency and a maximum late peak frequency. There are other embodiments as well.

In certain embodiments, the transceiver 100 is configured to detect loss of signal. For example, an incoming data stream is sampled and a recovered clock signal is generated from receiver accordingly. The recovered clock is then to transmitter for signal regeneration. An output clock signal of a higher frequency than the recovered clock signal is generated by a narrow-band transmission PLL. The frequency of the recovered clock signal is compared to a divided frequency of the output clock signal. If a difference between the recovered clock signal and the output clock signal is greater than a threshold error level, a loss of signal indication is provided. There are other embodiments as well.

Figure 2A:
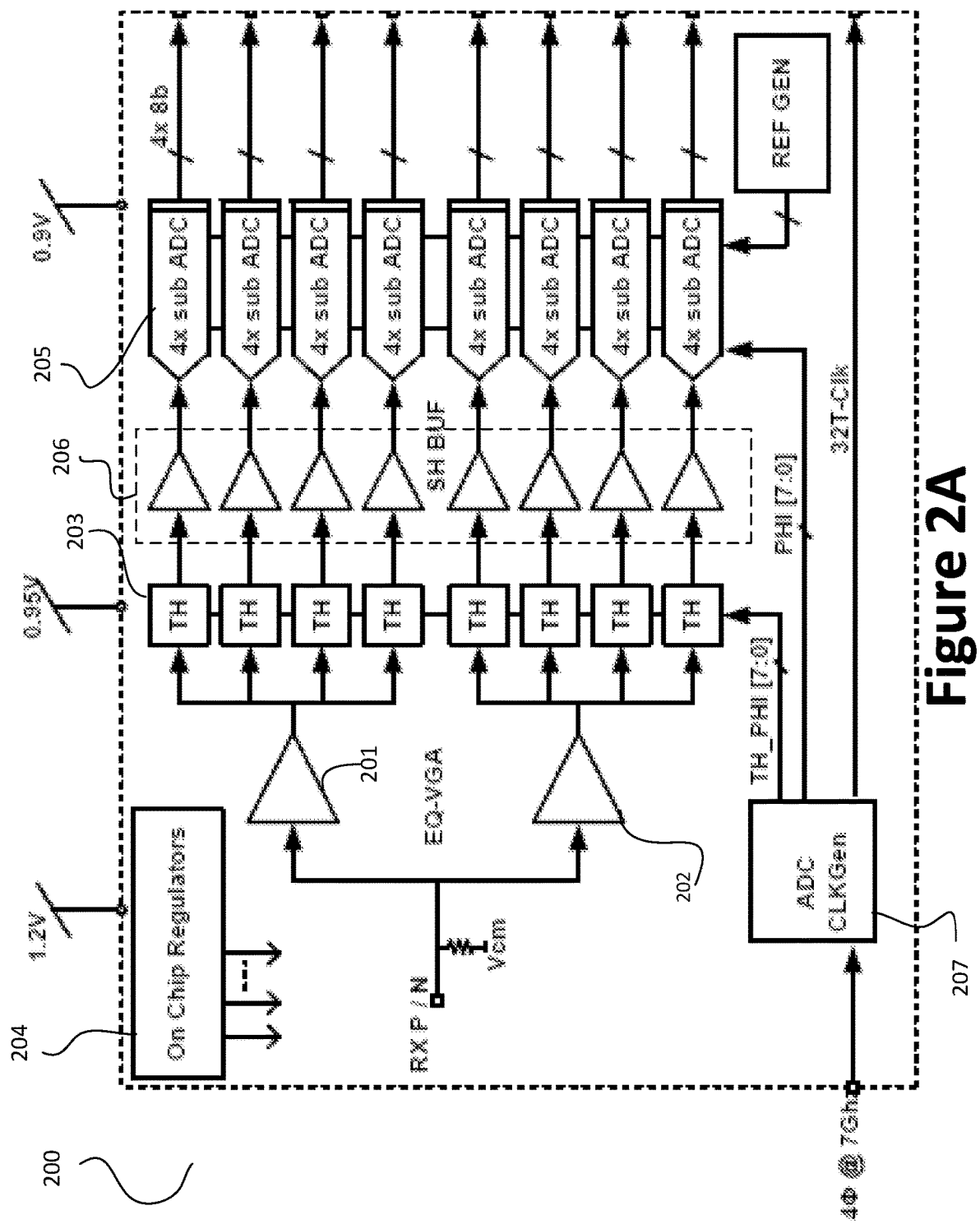
FIG. 2A is a simplified diagram illustrating a transceiver system with multiple data lanes.

FIG. 2A is a simplified diagram illustrating a transceiver system with multiple data lanes. This diagram is merely an example, which should not unduly limit the scope of the claims. One of ordinary skill in the art would recognize many variations, alternatives, and modifications. Transceiver 200 comprises EQ-VGA modules 201 and 202. For example, EQ-VGA module 201 integrates an equalizer ("EQ") and a voltage gain amplifier ("VGA"). It is to be appreciated by using integrated EQ-VGA modules, power consumption and efficiency are improved. In addition, by reducing interconnect and wiring between the equalizer and the VGA, total-harmonic distortion (THD) at system power-on is reduced.

In certain embodiments, a continuous time linear equalization (CTLE) is used to process the incoming data stream and provide an offset correction as needed. For example, a CTLE module for receiving input data signal is set to an isolation mode, and one or more sense amplifiers perform data sampling asynchronously during the isolation mode. During the isolation mode, CLTE(s) that are not directly connected to the sense amplifiers are shut. Data sampled during the isolation mode are used to determine an offset value that is later used in normal operation of the SERDES system. There are other embodiments as well.

Figure 2B:
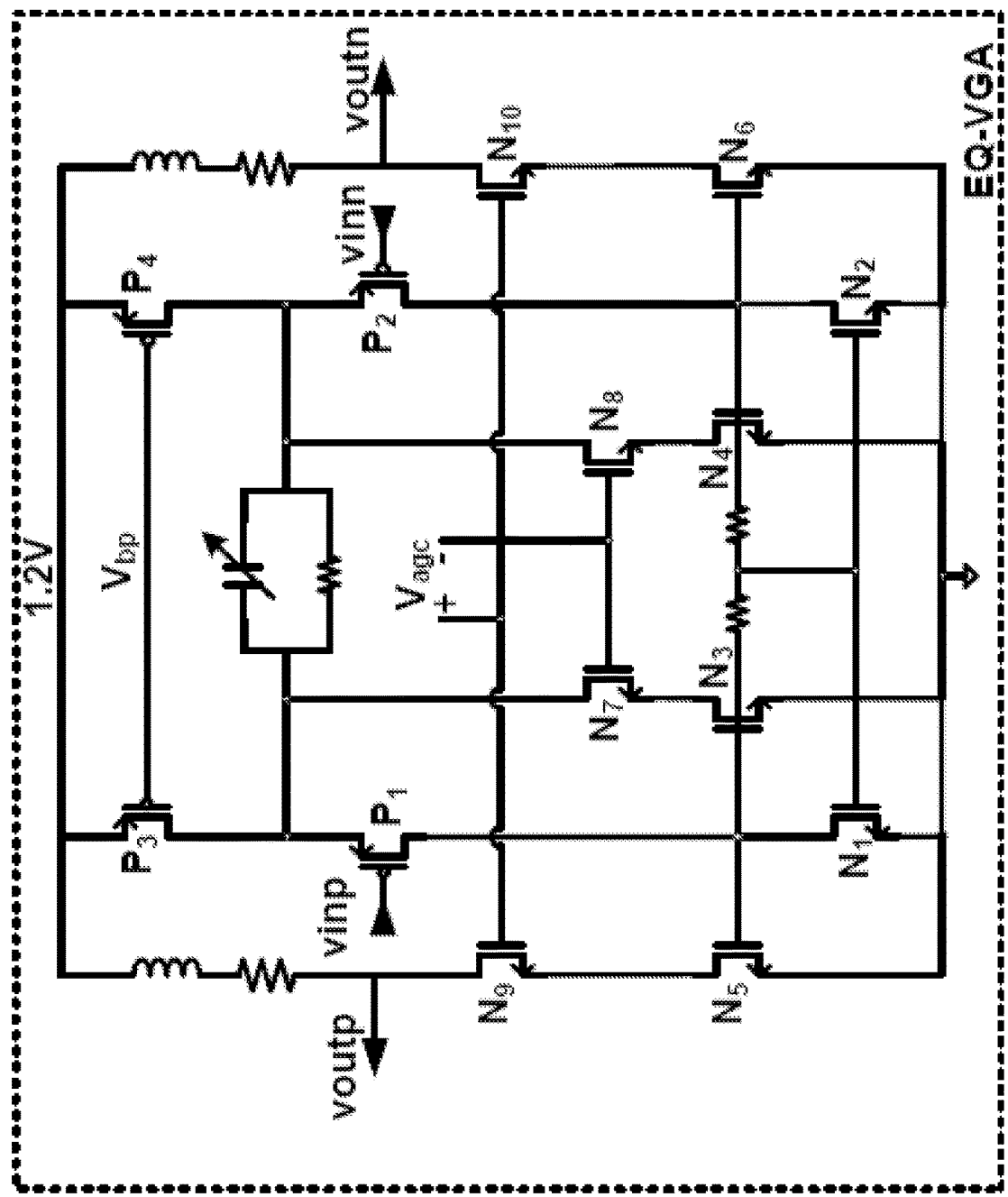
FIG. 2B is a simplified diagram illustrating an integrated EQ-VGA module according to an embodiment of the present invention.

FIG. 2B is a simplified diagram illustrating an integrated EQ-VGA module according to an embodiment of the present invention. This diagram is merely an example, which should not unduly limit the scope of the claims. One of ordinary skill in the art would recognize many variations, alternatives, and modifications. As shown in FIG. 2B, input voltages are received as a pair, $v_{in\_p}$ and $v_{in\_n}$, and they are provided to the input transistors $P_1$ and $P_2$ respectively. After equalization and voltage gain are performed, output voltage pairs $v_{out\_p}$ and $v_{out\_n}$ are provided. According to various embodiments, the VGA is characterized by a gain range of at least 12 dB in 0.1 dB steps and a bandwidth of at least 13 GHz. For example, a high-frequency gain-boost of up to 8 dB increases signal energy in high loss channels. The integrated VGA and equalizer achieves a signal to noise ratio (SNR) of at least 41.7 dB and THD of at least 36 dB overall gain, boosting and processing corners with full-scale outputs. The EQ-VGA uses trans-conductance (gm)-boosted source degeneration, which improves linearity by reducing the nonlinear gate-to-source voltage ($v_{gs}$) variation of transistors P1 and P2 by the respective loops created by N1-N3-N7 and N2-N6-N8. It is to be appreciated that programmable gain is achieved through differentially modulating the mirrored trans-conductance gain via the $v_{ds}$ bias on N3-N5 and N4-N6.

Now referring back to FIG. 2A. The EQ-VGA modules 201 and 202 drive the track and hold ("T/H") circuits. In an embodiment, the EQ-VGA modules perform coarse equalization to reduce dynamic range requirements of the ADC 207. In a specific embodiment, each of the EQ-VGA modules drives four T/H switches. For example, the EQ-VGA module 201 drives the top four T/H switches, and the EQ-VGA drives the bottom four T/H switches. Depending on the specific implementation, the T/H switches can be configured to operate in various frequencies. For example, for 28 Gb/s data communication, each of the T/H switches operates at 3.5 GS/s. Data held by the T/H switches are stored at the sample-and-hold (SH) buffer 206. At shown in FIG. 2A, the SH buffer 206 comprises 8 buffer units that corresponds to 8 T/H switches, which stores data that T/H switches hold. The SH buffer 206 is connected to ADCs (e.g., ADC 205), which use a feed-forward based negative-$g_{ds}$ technique and is preferable to simple source followers to optimize signal-to-noise performance and linearity at low supply voltages. In various embodiments, a replica circuit controls the negative-$g_{ds}$ in the buffers ensuring constant gain over process, voltage, and temperature. Each of the 32 (4 for each lane) sub-ADCs is a successive approximation register (SAR) core clocked at a predetermined frequency (e.g., 7 GHz for 28 Gb/s communication link). It is to be appreciated that independent reference buffers minimize nonlinear and signal-dependent noise coupling between channels.

Figure 3:
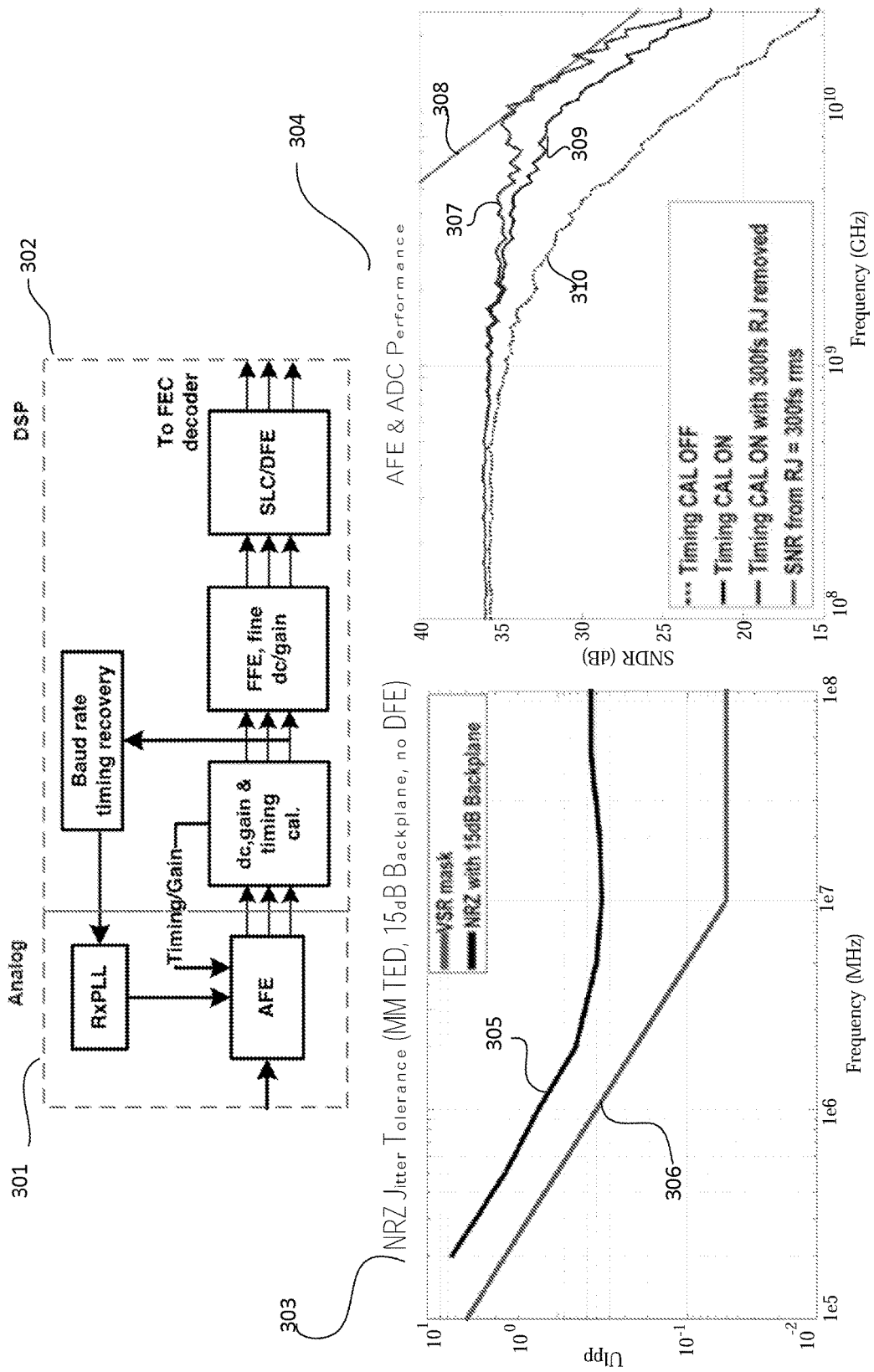
FIG. 3 is a simplified diagram illustrating a DSP module according to an embodiment of the present invention.

Now referring back to FIG. 1. As shown, system 100 includes DSP modules for data processing. FIG. 3 is a simplified diagram illustrating a DSP module according to an embodiment of the present invention. This diagram is merely an example, which should not unduly limit the scope of the claims. One of ordinary skill in the art would recognize many variations, alternatives, and modifications. The digital signal processing (DSP) module 302 as shown in coupled to an analog module 301. The analog module 301 includes, among other components, a PLL module and an analog front end (AFE) module. In various embodiments, the PLL module recovers clock signal from received data. The AFE module provides signal conditioning. As shown in FIG. 3, the AFE module is coupled to the DSP module 302, which performs calibration for offset, gain, timing skew estimation and correction of the analog front-end. For example, the gain of the 32 interleaved channels is estimated using an envelope detector. Gain mismatch is compensated by adjusting the associated reference voltage which maximizes range of each ADC slice. Residual gain errors are further corrected in the digital domain. Offsets of each interleaved channel are estimated digitally by computing the average of the slicer error at the output of the feed forward equalization (FFE) that corresponds to each signal path. Depending on the specific implementation, dynamic range of the ADC can be configured as a tradeoff for offset correction to avoid DACs in the signal path that would degrade bandwidth. For example, timing mismatch is digitally estimated by using correlated properties of the PAM input signal. For example, digital controls are fed back to small delay cells that alter the sampling phases of the 8 T/H clocks with a resolution of for about 100 fs. It is to be appreciated that the DSP module 302, working in conjunction with the analog module 301, can provide substantial performance improvement. For example, plot 303 provides an NRZ jitter tolerance. More specifically, plot line 305 shows performance with NRZ with 15 dB backplane, and the plot line 306 shows performance with very short reach (VSR) mask. VSR Mask Plot 304 provides an SNDR of the entire front-end and the impact from timing calibration. More specifically, plot line 308 shows SNR from a RJ setting of 300 fs RMS, plot line 307 shown performance for setting with timing CAL ON with 300 fs RJ removed, plot line 309 shows performance with timing calibration turned on, and plot line 310 shows performance with timing calibration turned off.

In certain embodiments, the DSP module uses a Management Data Input/Output (MDIO) for providing serial data communication, which includes management data I/O, data communication, and device configuration. For example, information related to skew management, reflection cancellation, and various signal characterized measured by a receiving system is communicated through the MDIO.

In various embodiments, the DSP module 302 employs a set of parallel FFEs for channel equalization. The parallel factor was chosen to be a multiple of the number of sub-ADC channels to minimize power consumption. Bandwidth mismatch between the different AFE paths is compensated by independent adaptation of the FFE slices. The DSP module 302 also includes an adaptive PAM4 decision feedback equalizer (DFE). The feedback taps are limited to one tap to reduce the impact of error propagation. In various embodiments, the DSP module 302 performs reflection cancellation to reduce noise. For example, reflection cancellation techniques are described in U.S. patent application Ser. No. 14/597,120, filed 14 Jan. 2015, entitled "PAM DATA COMMUNICATION WITH REFLECTION CANCELLATION".

According to various embodiments, baud-rate clock recovery techniques is based on a Mueller-Muller timing recovery scheme, and involves taking inputs directly at the ADC output, thus eliminating interaction problems with FFE-DFE adaptation while providing a low latency clock recovery path. A measured jitter tolerance plot for NRZ modulation is shown in plot 303 against a VSR mask. The clock recovery scheme can be made truly reference-less by taking advantage of the reference-less HOST VSR Link. The recovered clock is filtered prior to ADC sampling. Depending on the implementation, by eliminating the need for a reference clock and only uses clock signal recovered from incoming data, power consumption and chip area can be reduced. For example, data rate program without reference clock signal is described in U.S. patent application Ser. No. 14/681,989, filed 8 Apr. 2015, entitled "DATA RATE PROGRAMMING USING SOURCE DEGENERATED CTLE".

Figure 4A:
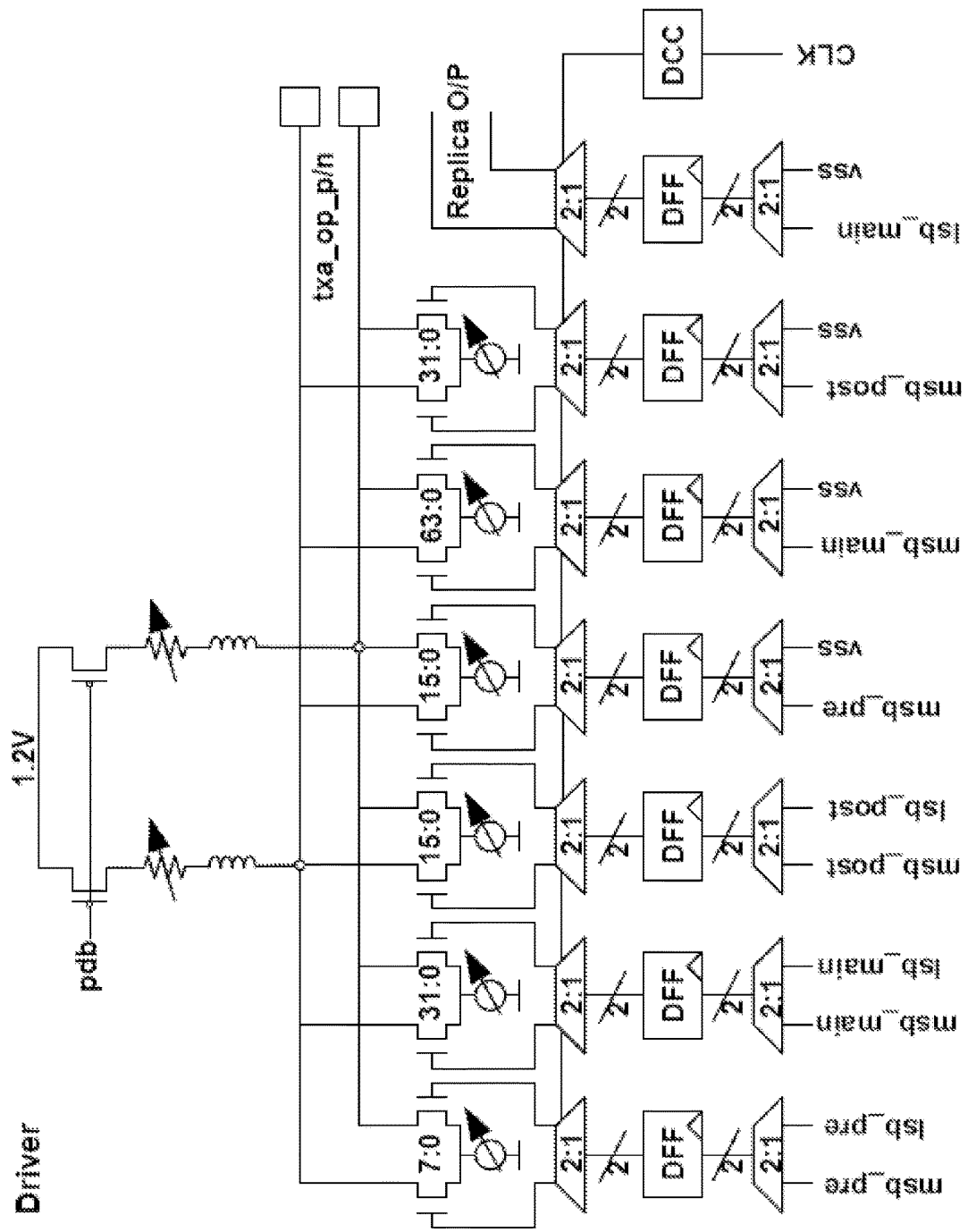
FIG. 4A is a simplified diagram illustrating a driver according to an embodiment of the present invention.

At the driver stage, common-mode logic (CIVIL) configuration is used. FIG. 4A is a simplified diagram illustrating a driver according to an embodiment of the present invention. This diagram is merely an example, which should not unduly limit the scope of the claims. One of ordinary skill in the art would recognize many variations, alternatives, and modifications. In various embodiments, line transmitters are configured as two PAM or four NRZ Links. With four NRZ links, the system provides support for segmented modulators that generate PAM-4 in the optical domain. As shown in FIG. 4A, the CML implementation of driver is configured with shunt peaking in the final stage. For example, the driver provides swing levels up to 1.4 Vpp and incorporates a 3-Tap finite impulse response (FIR) filter with independent control on the MSB and LSB paths. The MSB to LSB ratio can also altered for providing compensation on the PAM-4 eye, which is useful in applications where the PAM transmitter interfaces with optical drivers. For example, eye modulation is performed to compensate for distortion that occurs during data transmission and to equalize signal-to-noise level among different eye levels.

In certain implementations, eye modulation is performed at the transmission side of a PAM communication system to compensate for distortion and non-linearity and generate an output waveform. Spacing among eye levels is adjusted by performing symmetric modulation using α parameter and asymmetric modulation using β parameter. A correction module measures the output waveform and sends feedback signals to a control module to adjust the α parameter and the β parameter. There are other embodiments as well.

Figure 4B:
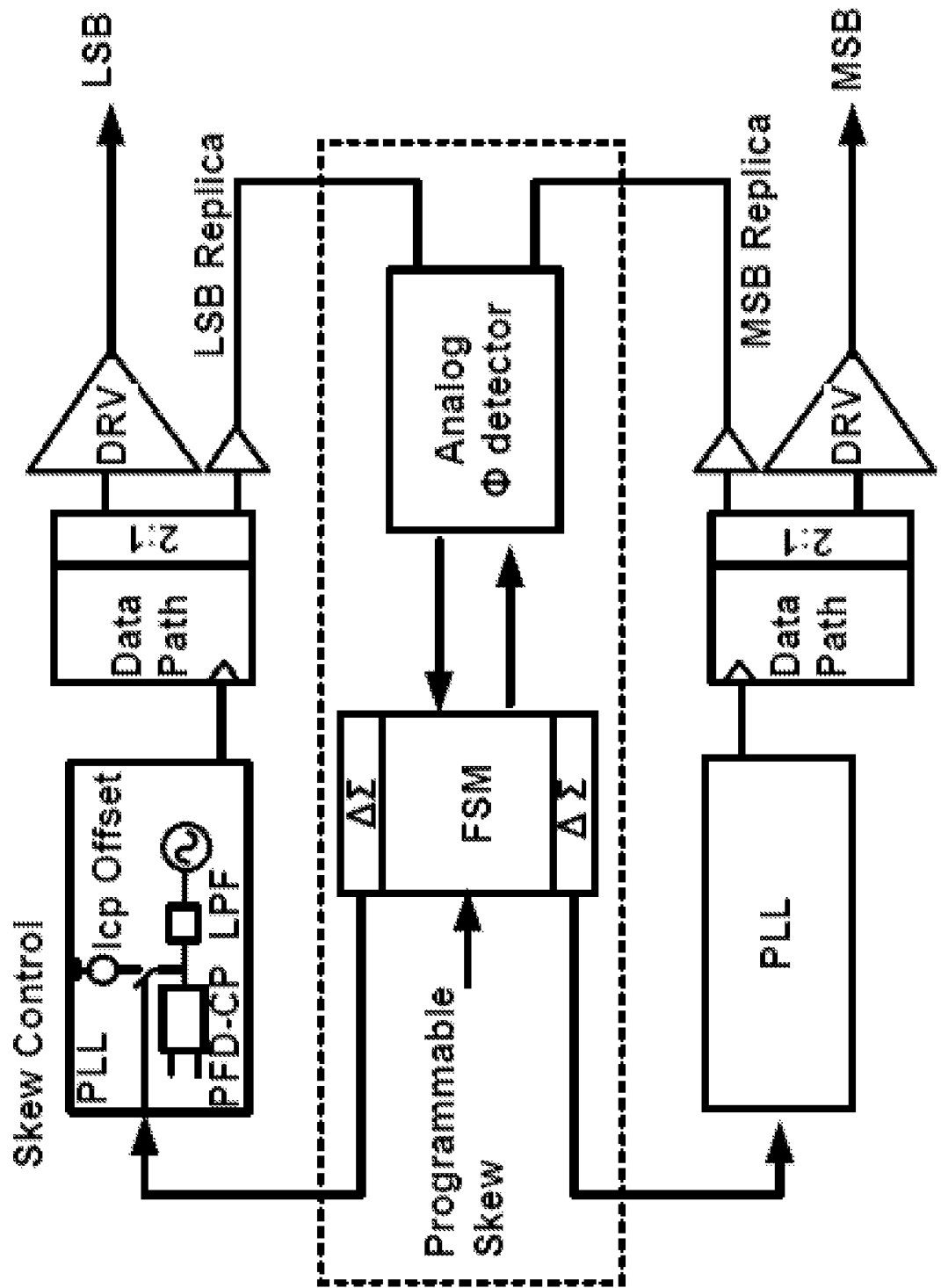
FIG. 4B is a simplified diagram illustrating a skew management system according to an embodiment of the present invention.

In various embodiments, transceiver system according to embodiments of the present invention provide skew control mechanism that auto-zeroes electrical and logical skew in NRZ mode. Additionally, the system can pre-compensate skews (e.g., less than 1 UI) that occur downstream. FIG. 4B is a simplified diagram illustrating a skew management system according to an embodiment of the present invention. This diagram is merely an example, which should not unduly limit the scope of the claims. One of ordinary skill in the art would recognize many variations, alternatives, and modifications. For example, an analog phase detector senses the skew and a finite state machine (FSM) corrects for screw by adjusting the offset in the PLL charge-pump. A delta-sigma modulator driving this offset current provides very fine control of the PLL phase (resolution <100 fs). The FSM also calibrates the loop to be able to introduce the required skew and maintain it over operating conditions. In actual implementation, the noise introduced by the offset delta-sigma is substantially negligible. In an exemplary implementation, the entire system shows a simulated 3σ error of less than +/−0.5 ps peak-to-peak due to mismatches.

According to various embodiments, skew management functions are performed by a skew management module. The skew management module generates a control current based on output test patterns of the two communication lanes. The control current is integrated and compared to a reference voltage by a comparator, which generates an analog offset signal. A PLL of one of the communication lanes generates a corrected clock signal that is adjusted using the analog offset signal to remove or adjust the skew between the communication lanes. The corrected clock signal is used for output data.

Figure 5:
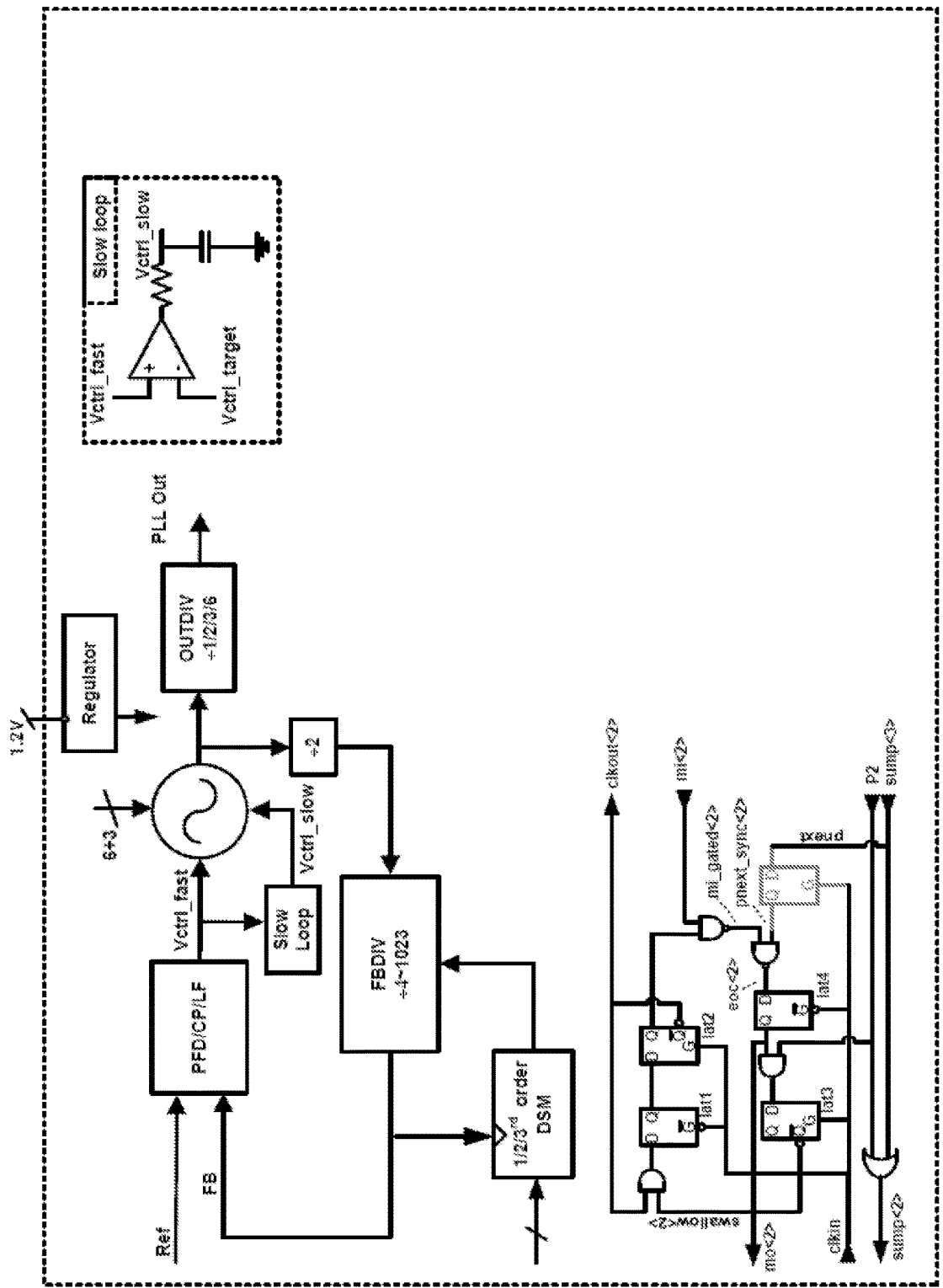
FIG. 5 is a simplified diagram illustrating a fractional PLL according to an embodiment of the invention.

As mentioned above, PLLs are used to provide clock signals. FIG. 5 is a simplified diagram illustrating a fractional PLL according to an embodiment of the invention. This diagram is merely an example, which should not unduly limit the scope of the claims. One of ordinary skill in the art would recognize many variations, alternatives, and modifications. For example, a fractional-N PLL provides the required clocks for the TX and RX paths. In an implementation, the voltage controlled oscillator (VCO) is inductor-based with dual tuning paths (9.9 to 15.5 GHz). An amplifier and RC filter form a slow path that drives $V_{ctrl\_fast}$ close to a target voltage. It is to be appreciated that this implementation offers many advantages. The fractional PLL maximizes charge pump headroom and linearity, and it stabilizes the fast loop $K_{vco}$ over tuning range, tracks temperature, and reduces the loop filter size. In various implementations, the multi-modulus (MM) divider is based on Vaucher's extended range topology, which enables transition across stage boundaries smoothly overcoming a key limitation in the original topology. It is to be appreciated that the factional DLL illustrated in FIG. 5, in an exemplary implementation, can have a characterized by a low integrated RMS jitter of 182 fs on the TX outputs in a frequency band of 1 KHz-100 MHz.

Figure 6A:
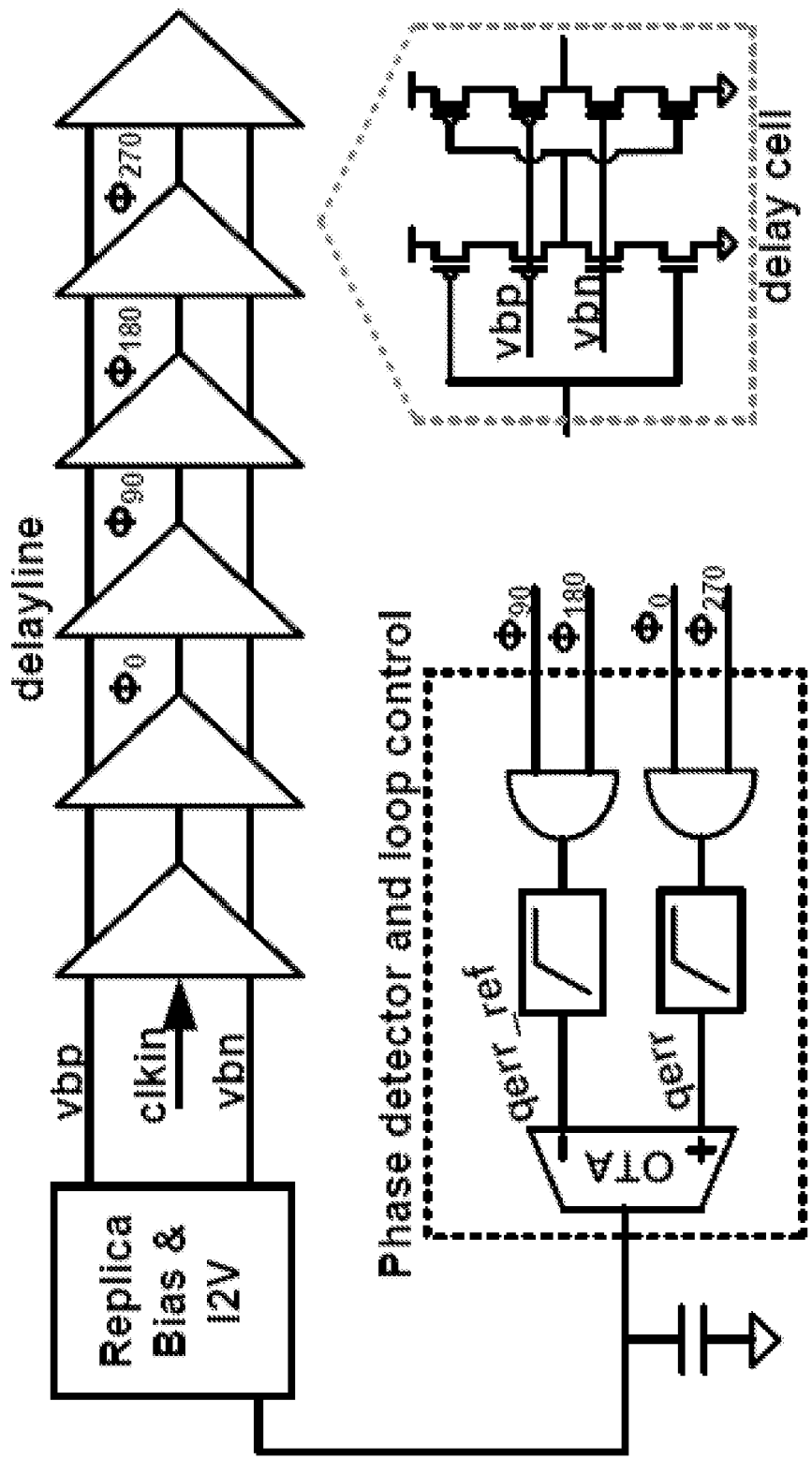
FIG. 6A is a simplified diagram illustrating a delay lock loop that generates different phases according to an embodiment of the present invention.

For data communication, timing phases are often needed. In various embodiments, delay lock loop (DLL) is used to generate timing phases. FIG. 6A is a simplified diagram illustrating a delay lock loop that generates different phases according to an embodiment of the present invention. This diagram is merely an example, which should not unduly limit the scope of the claims. One of ordinary skill in the art would recognize many variations, alternatives, and modifications. As shown in FIG. 6A, a DLL generates the timing phases for the ADC from a 7-GHz clock from the PLL. Static phase offset (SPO) is often a challenge in DLLs. A differential quadrature phase detector achieves the goal of low SPO allowing for healthy timing margins in the ADC clocking and easing start up of the DSP engine.

In various embodiments, phase-interpolator is implemented in conjunction with a delay-lock loop (DLL) and an SR latch, where one or more outputs of the DLL is used by the SR latch. Additionally, such techniques can be used for a variety of applications such as network and/or computer storage systems, computer servers, hand held computing devices, portable computing devices, computer systems, network appliances and/or switches, routers, and gateways, and the like.

Figure 6B:
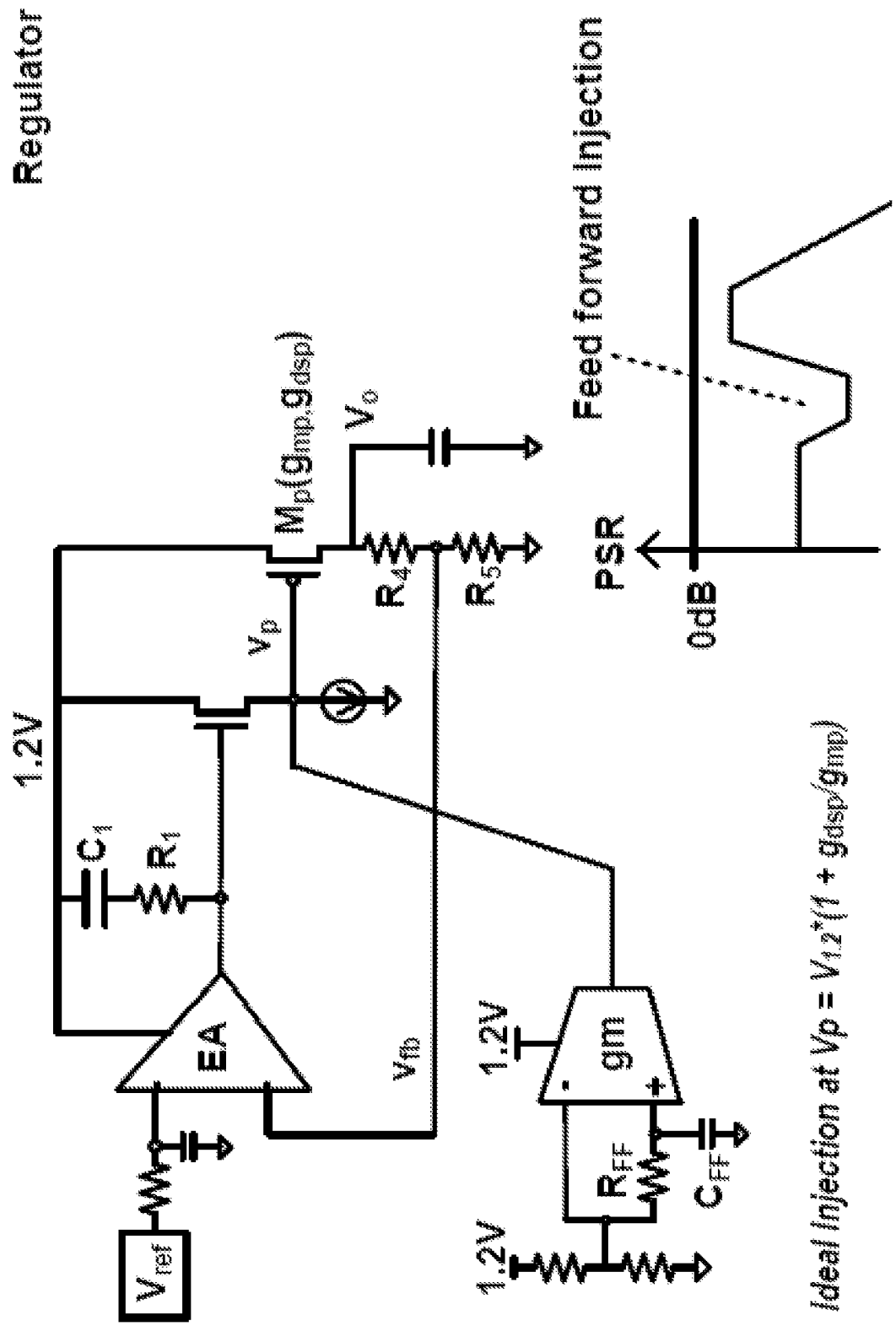
FIG. 6B is a simplified diagram illustrating a regulator according to an embodiment of the present invention.

In addition, embodiments of the present invention also power supply noise management. FIG. 6B is a simplified diagram illustrating a regulator according to an embodiment of the present invention. This diagram is merely an example, which should not unduly limit the scope of the claims. One of ordinary skill in the art would recognize many variations, alternatives, and modifications. It is to be appreciated that power supply noise management is an important aspect of high performance communication links. Both power supply rejection ratio (PSRR) and random noise from regulators impact over-all SNR of the analog front-ends. The regulator topology shown in FIG. 6B uses feed-forward injection. The frequency of injection is tuned to attenuate external switching regulator noise, which can often occur around PLL corner frequencies. This attenuation allows for reduced on-board filtering requirements. In addition, source degeneration is employed in the error amplifier to further reduce 1/f noise contributors.

Depending on the specific implementation, transceiver system according to embodiment of the present invention can be manufacturing using various types of fabrication processes. For example, 28 nm CMOS logic process can be used to fabricate the transceiver system. In a specific implementation, a transceiver system (e.g., transceiver system 100 in FIG. 1) consumes about 2.4 W of power from 1.2V and 0.9V power supplies, with FEC bypassed. There are other embodiments as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A communication device comprising:
   an analog front end (AFE) comprising:
      a track and hold (T/H) module configured to track and hold a first driving signal to produce a plurality of sample signals, the first driving signal being based on an input data stream;
      a shift and hold (S/H) module configured to store the plurality of sample signals; and
      an analog-to-digital converter (ADC) module configured to respectively convert the plurality of sample signals to a plurality of digitized sample signals, the ADC module including a plurality of ADC slices respectively corresponding to the plurality of digitized sample signals;
   a digital signal processing (DSP) module configured to calibrate the AFE based on the plurality of ADC slices corresponding to the plurality of digitized sample signals and to generate an output data stream comprising the plurality of digitized samples; and
   a skew management module configured to (i) detect a skew of the plurality of digitized sample signals in the output data stream generated by the DSP module, the skew corresponding to either one of a timing skew between respective signals of the plurality of digitized sample signals and a logical skew of pulses in the respective signals, (ii) generate a programmable skew offset based on the detected skew, and (iii) correct the skew in the output data stream based on the programmable skew offset.

2. The device of claim 1 further comprising a phase lock loop module for recovering a clock signal from the input data stream, the skew management module being further configured to detect the skew based on the recovered clock signal.

3. The device of claim 1 wherein the DSP module is configured to:
calibrate the AFE by:
adjusting reference voltages of the plurality of ADC slices; and
correcting a residual gain error of the AFE that remains after adjustment of the reference voltages.

4. The device of claim 1 wherein the DSP module comprises a set of parallel feed forward equalizers configured to perform channel equalization.

5. The device of claim 1, T/H module being configured to track and hold the first driving signal at a first frequency that is about twice a frequency of the input data stream.

6. The device of claim 1 further comprising a power regulator coupled to a power source, the power regulator configured to regulate power supplied to the AFE by performing feed-forward injection of a frequency tuned to attenuate noises associated with the power source.

7. The device of claim 1 wherein the DSP module comprises a baud rate timing recovery module configured to recover a clock signal from the input data stream.

8. The device of claim 1 further comprising a clock generation module configured to generate a clock signal based at least on the input data stream and to provide the clock signal to at least one of the AFE and the DSP module.

9. A method for processing an input data stream, the method comprising:
receiving the input data stream;
generating a first driving signal by amplifying the input data stream;
tracking and holding the first driving signal at a second frequency to produce a plurality of sample signals;
converting the plurality of sample signals to a plurality of digitized sample signals using a plurality of ADC slices respectively corresponding to the plurality of digitized sample signals;
generating an output data stream using the plurality of digitized sample signals;
detecting a skew of the plurality of digitized sample signals in the output data stream, the skew corresponding to either one of a timing skew between respective signals of the plurality of digitized sample signals and a logical skew of pulses in the respective signals;
generating a programmable skew offset based on the detected skew; and
correcting the skew in the output data stream based on the programmable skew offset.

10. The method for processing an input data stream of claim 9 further comprising modulating the output data stream to transmit the output data stream in a pulse amplitude modulated (PAM) format.

11. The method for processing an input data stream of claim 9 further comprising generating a clock signal based on the input data stream.

* * * * *